United States Patent [19]

Gilden

[11] 4,325,032
[45] Apr. 13, 1982

[54] PRF STABILIZED SURFACE ACOUSTIC WAVE OSCILLATOR

[75] Inventor: Meyer Gilden, West Hartford, Conn.

[73] Assignee: United Technologies Corporation, Hartford, Conn.

[21] Appl. No.: 129,438

[22] Filed: Mar. 11, 1980

[51] Int. Cl.³ .......................... H03L 7/08; H03L 7/18
[52] U.S. Cl. ................................... 331/25; 331/36 R; 331/107 A
[58] Field of Search ................... 331/9, 17, 18, 19, 25, 331/34, 36 R, 36 C, 107 A

[56] References Cited

U.S. PATENT DOCUMENTS 4,028,639 6/1977 Hagon et al. ................... 331/107 A

OTHER PUBLICATIONS

Grant et al. "Mobile Radio Frequency Synthesizer Based on Surface Acoustic Wave Oscillators", The Radio and Electronic Engineer, vol. 47, May 1977, pp. 209–216.

Primary Examiner—Siegfried H. Grimm
Attorney, Agent, or Firm—M. P. Williams

[57] ABSTRACT

Mode locked surface acoustic wave oscillators, configured as comb spectrum generators, are stabilized by means of a variable phase in the closed, oscillation loop, the phase being controlled in response to deviations of the low, pulse repetition frequency from a design reference PRF. The variable phase may be provided by a variable phase device inserted in the oscillatory loop, such as varactor-tuned lumped element delay lines or 90° hybrids, or other devices. Or, the variable phase may be provided by a voltage tunable surface acoustic wave device used as the basic oscillator SAW delay line.

3 Claims, 2 Drawing Figures

PRF STABILIZED SURFACE ACOUSTIC WAVE OSCILLATOR

The Government has rights in this invention pursuant to Contract No. F19628-77-C-0223 awarded by the Department of the Air Force.

BACKGROUND OF THE INVENTION

1. Field of Art

This invention relates to mode locked surface acoustic wave oscillators used as comb spectrum generators, and more particularly to stabilization thereof by means of the pulse repetition frequency.

2. Description of the Prior Art

There are a variety of electronic technologies, such as frequency synthesizers employing electronic selection of various combinations of reference frequencies, which require sets of stable reference signal sources. One such device which has found favor is a comb spectrum generator employing a surface acoustic wave delay line as the frequency determining element in an oscillator. As is known, if the oscillatory loop includes a nonlinear device to suppress low amplitude signals but sustain higher amplitude signals, such as a repressed amplifier or a diode signal expander, the oscillations can be maintained in a repetitive pulse mode, rather than settling into a continuous wave mode. The pulses each include frequency components which are within the bandwidth of the delay line and related thereto by integer numbers; similarly, the repetition frequency of the pulses are related to the inverse of the time delay of the SAW device in an integer fashion. The use of surface acoustic wave devices provides the inherent advantages of small device size and reproducible manufacturing inherent in microelectronic processing technology. Further, the surface acoustic wave devices avoid the need for post-manufacture trimming to precise characteristics, as may be the case in bulk mode crystal devices.

The surface acoustic wave delay line should have a reasonable insertion loss (on the order of 20 dB, or less) while at the same time having a sufficient broad band of frequency response to provide the desired comb spectrum in the output. Depending upon the use to which a device is to be put, the required stability may be as great as one tenth of a part per million. This stability is of course dependent upon the range of temperatures of the intended environment of the device and the sensitivity of the device to temperature variations. For instance, a surface acoustic wave device utilizing a quartz substrate may have adequate temperature stability, but since the piezoelectric effect is not very strong, many fingers would be required in the piezoelectric coupling transducers; since the bandwidth is inversely related to the number of elements in the transducers, selection of a quartz substrate for temperature stability would be at the expense of wide bandwidth. On the other hand, lithium niobate substrates have a sufficiently strong piezoelectric effect to permit coupling signals to and from the SAW device with transducers having only a few fingers, while maintaining relatively low insertion loss, and thereby achieving a broad band frequency response. But, the lithium niobate substrate has a temperature sensitivity which is higher than that of quartz, and in some applications is excessive. Therefore, the desired characteristics of low insertion loss, wide bandwidth and frequency stability cannot be provided in a surface acoustic wave comb spectrum generator without compensation, or control over the temperature of the environment.

In the past, (eg, see: M. Gilden, "Stabilized SAW Comb Spectrum Generator," 1977 Ultrasonics Symposium, p. 927), injection phase locking for frequency stabilization of the comb spectrum generator was achieved by injecting a low level RF CW signal into the feedback loop. However, stabilization was achievable only over an inadequately small temperature range. A similar stability method utilized subharmonic injection phase locking at the pulse repetition frequency. However, because the energy in the subharmonic synchronizing pulses is concentrated at the low end of the frequency spectrum, sufficient interaction with the RF components of the comb signal for adequate stabilizing effect is obtainable only for excessively large amplitudes of subharmonic injection signals, with attendant large background noise. The presence of noise in the output rendered a comb spectrum generator inadequate for applications of the type requiring the stability which was sought.

SUMMARY OF THE INVENTION

Objects of the invention include improvements in frequency stabilization of comb spectrum generators employing SAW delay lines.

According to the present invention, the oscillatory loop of a comb spectrum generator is provided with a variable phase shift as a function of undesirable variations in pulse repetition frequency of the comb spectrum generator output, whereby frequency stability of the related RF signals is achieved by stabilization to the related pulse repetition frequency thereof. According further to the invention, the variable phase shift may be provided by a tunable element inserted into the oscillatory loop in series with a SAW delay line element. In still further accord with the invention, the variable phase shift may be implemented by means of the principal, frequency determining element of the oscillatory loop comprising a voltage tunable SAW delay line.

The present invention allows utilization of relatively simple, lower frequency techniques to provide stability of a plurality of PRF-related RF CW signals provided by a SAW comb spectrum generator. The invention is readily implemented utilizing microcircuit processing technology and other techniques and apparatus which are readily available in the art, in the light of the teachings which follow hereinafter.

Other objects, features and advantages of the present invention will become more apparent in the light of the following detailed description of exemplary embodiments thereof, as illustrated in the accompanying drawing.

DETAILED DESCRIPTION

Figure 1:
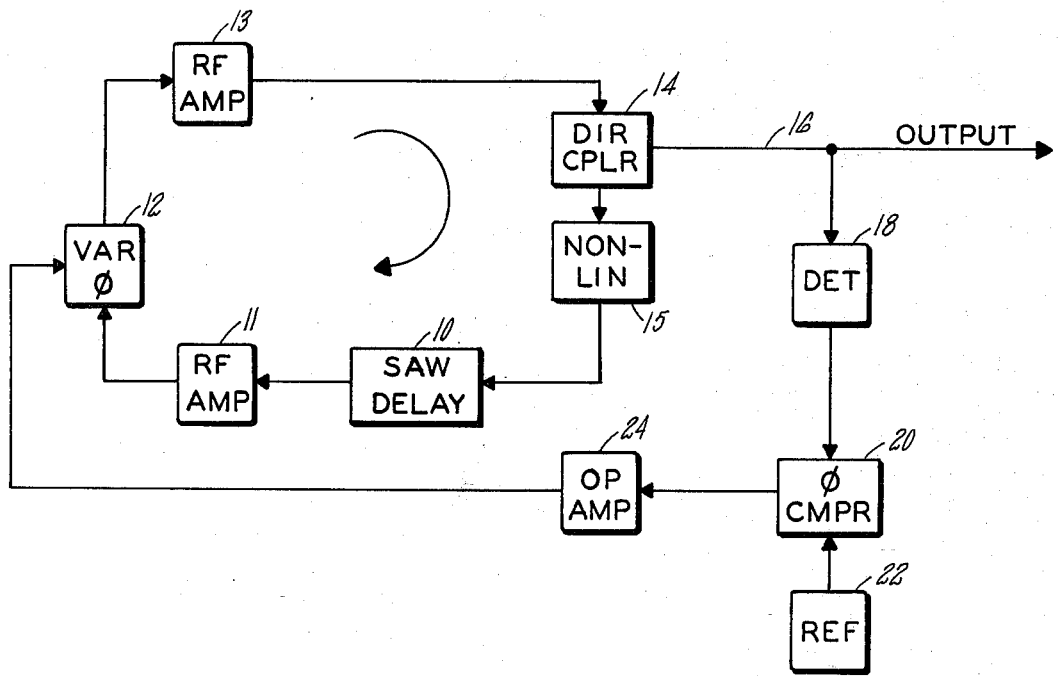
FIG. 1 is a schematic diagram of a first embodiment of the invention employing a variable phase device inserted in the oscillatory loop of a SAW comb spectrum generator.

Referring now to FIG. 1, a surface acoustic wave delay line 10 is of a conventional sort, having input and output coupling transducers, such as metal films forming interdigital fingers on the surface of Y-cut lithium niobate, the transducers disposed for wave propagation in a Z direction. The output of the SAW delay line 10 is passed through an RF amplifier 11 to a variable phase device 12, examples of which are described hereinafter. In accordance with the invention, the variable phase device 12 inserts a phase shift directly in the oscillatory loop that includes the SAW delay line 10, as is described more fully hereinafter. The variable phase device 12 is connected to an RF amplifier 13, the output of which feeds a directional coupler 14 of a conventional type.

A small portion of the oscillatory signal, on the order of 10 dB or so, is coupled to an output line 16, the remaining signal recirculating in the oscillatory loop, through a nonlinear, thresholded coupling unit 15. This may comprise a diode signal expander using a lumped element transformer, or any other suitable highly nonlinear device, but preferably comprises a repressed amplifier of the type disclosed and claimed in a copending application of Gilden and Ruckus, REPRESSED AMPLIFIER FOR MODE LOCKED OSCILLATOR, Ser. No. 65,472, filed on Aug. 10, 1979. This is an RF transistor amplifier operating at about a fifth of its design supply voltage, with a series output capacitor, that provides output signals only in response to input signals that are in excess of a threshold. The threshold is determined by the magnitude and repetition rate of input signals, so that only the maxima of signals generated in the oscillatory loop are coupled to the output, whereby the initial pulses in the oscillatory loop, made up of the harmonic-related RF frequencies within the passband of the delay line, are coupled through the loop. As described in the aforementioned copending application, this causes the initial start-up of only the strongest signals which comprise the summations of the harmonically related RF frequencies, that combine additively so as to form pulses of RF at a pulse repetition frequency which is a subharmonic of the RF frequencies. For instance, one of the RF line frequencies of a comb spectrum generator may be on the order of 300 megahertz, and the pulse repetition frequency may be on the order of 3 megahertz. The output of the nonlinear coupling device 15 is fed to an input transducer of the SAW delay line 10. Thus there is an oscillatory loop comprising the elements 10-15.

The object of the invention (improved stability for such an oscillatory loop) is provided by inserting a controlled phase shift directly in the oscillatory loop by means of the variable phase device 12. In the past, as is described in the aforementioned copending application, stabilization has been provided by injection-locking the loop by means of a reference RF signal injected into the loop by means of a directional coupler, similar to the coupler 14.

According to the invention, the envelope of the RF output signal is detected by a conventional RF detector 18 and is then fed to a phase comparator 20 along with a reference signal, at the desired pulse repetition frequency, from an oscillator or other frequency reference 22. The output of the phase comparator 20 is connected through an operational (high-gain) amplifier 24 and fed to a voltage control input of the variable phase device 12. As the PRF of the output varies, the phase comparator 20 will detect the magnitude and sense of the variation compared to the reference 22, and the op amp 24 will provide a corresponding corrective signal to the variable phase device 12. Thus a lead or a lag of a corrective magnitude can be provided in the oscillatory loop 10-15.

Depending on the overall characteristics of the loop, and particularly the loop dispersion, which relates changes in the RF frequency to changes in the inherent subharmonic pulse repetition frequency of a comb spectrum generator of the type shown in FIG. 1, control of the PRF will control the RF frequencies to a considerable extent. If the dispersion is low, so that the group velocity of waves is near the phase velocity of waves, resulting in a linear phase-frequency characteristic, the control of the PRF can provide nearly optimal control over the RF frequencies.

The variable phase device 12 may take any of a variety of forms. For instance, it may comprise a 90° hybrid consisting of coupled lines with variable shunt capacitances formed by varactors which are tuned by bias applied through RF chokes. And, other suitable devices may come to mind. However, at the present time, in order to reduce dispersion, and thereby provide a maximum relationship between control of the RF frequencies as a function of variations in the PRF, it is deemed preferable to use varactor tuned, lumped element delay line circuits. These comprise well known tee-sections consisting of a pair of series inductors with a shunt capacitor to ground, the capacitor comprising a varactor tuned by a voltage applied to the junction of the inductors and the varactor through an RF choke. It has been found that dispersion, and the attendant failure of the RF frequencies to track with the controlled PRF frequency, are reduced if a large number of lumped element sections are utilized, so that only a small portion of the tuning range of each of the elements need be employed, while the summation of phase delay across all of the elements provides the adequate variable phase in the oscillatory loop 10-15. Working each of the lumped element portions over a smaller voltage tuning range reduces the phase change in each of them, thereby also reducing the variation in impedance in the variable phase device 12. Maintaining good impedance matches throughout the loop reduces dispersion so that the phase frequency characteristics of the whole loop are more nearly linear, and the RF frequencies will track more closely to the pulse repetition frequency which is controlled by the variable phase device 12.

Two amplifiers 11, 13 are utilized in the embodiment of FIG. 1 since this is a way to provide the necessary loop gain to sustain oscillation at the various frequencies while at the same time providing good isolation and impedance matching between the principal elements 10, 12, 14. However, depending upon the particular manner in which the invention is implemented, only a single amplifier need be used if desired.

The detector 18 is of conventional type and may simply comprise a crystal diode. Similarly, the reference oscillator may comprise any well known form of clock circuit. The phase comparator 20 may be of any suitable type which is readily available in the art, such as an RCA Model No. CD 4046A or a Motorola Model No. MC 4044.

A second embodiment of the present invention does not insert additional phase by means of the variable phase device 12, but provides the phase control directly in the SAW device. In this case, a variable SAW delay line 10a is employed and feeds the amplifier 13 directly. The variable SAW delay line may comprise a voltage tunable gallium arsenide delay line of the type disclosed in a commonly owned copending application of Grudkowski, Ser. No. 11,612, filed Feb. 12, 1979, now Pat. No. 4,233,573, and entitled CARRIER CONCENTRATION CONTROLLED SURFACE ACOUSTIC WAVE VARIABLE DELAY DEVICES. Or, it may comprise other variable delay lines such as those disclosed as references in the aforementioned Grudkowski application. The particular nature of the delay line is related more to the utilization to which the invention is to be put than to the invention itself. The embodiment of FIG. 2 also illustrates that the reference 22a may be at a frequency much lower than the PRF of the oscillatory loop provided that a frequency divider 26 is employed in order to reduce the output frequency of the detector 18 to that of the reference 22a. This may be desirable in some cases in order to provide a more stable reference oscillator 22a per unit cost, where deemed practical. In other respects, the embodiment of FIG. 2 operates in a manner similar to the embodiment of FIG. 1.

Figure 2:
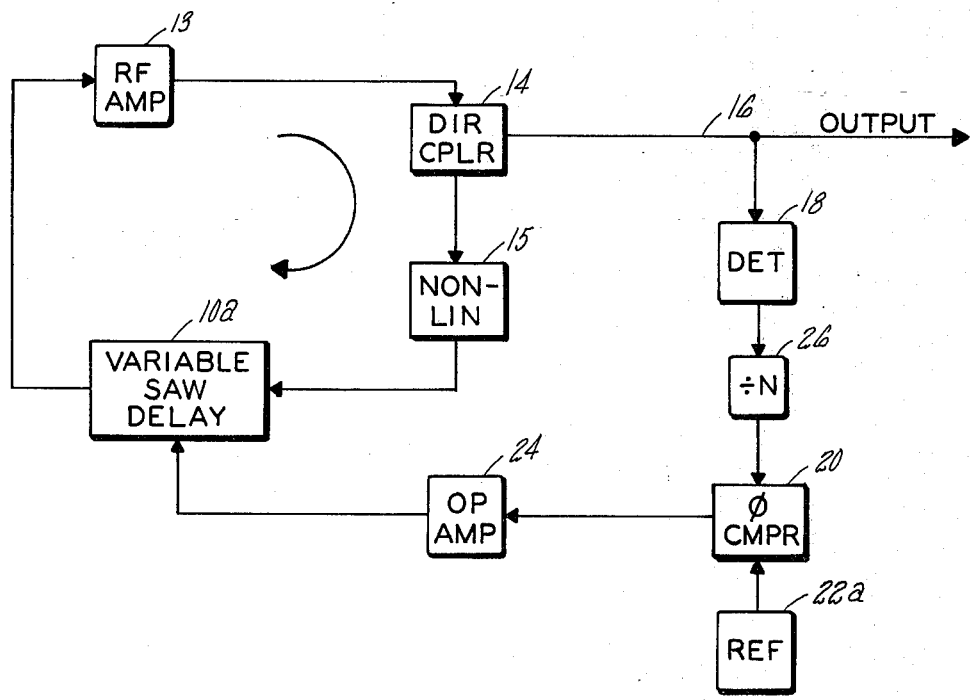
FIG. 2 is a schematic diagram of a second embodiment of the invention in which the variable phase delay is provided by a voltage tunable SAW delay line.

In particular, the embodiment of FIG. 2 varies the wave velocity characteristic of the variable SAW delay line 10a by means of the voltage applied thereto by the op amp 24. It therefor makes minor changes in the overall phase velocity of the loop, whereby the pulse repetition frequency and the related RF frequencies are controlled in the same manner as in the embodiment of FIG. 1.

Thus, the oscillatory loop in the stabilized SAW comb spectrum generator of the present invention requires a variable delay means, which may consist of the combination of a fixed SAW delay 10 and a variable phase device 12 operating in series as in the embodiment of FIG. 1, or it may comprise a variable SAW delay line 10a as in the embodiment of FIG. 2. At the present time, the embodiment of FIG. 1 is preferred since it allows maximizing the various desired parameters of a SAW comb spectrum generator employing the invention. However, it is contemplated that, as voltage tunable variable SAW delay devices are improved in the art, the embodiment of FIG. 2 may be preferable since it is expected that the reduced circuit components should reduce dispersion and provide closer tracking of the RF frequencies to the PRF, as described hereinbefore.

Similarly, although the invention has been shown and described with respect to exemplary embodiments thereof, it should be understood by those skilled in the art that the foregoing and various other changes, omissions and additions may be made therein and thereto, without departing from the spirit and the scope of the invention, which encompasses SAW comb spectrum generator RF frequency control as a function of PRF to control the RF frequencies thereof.

Having thus described typical embodiments of my invention, that which I claim as new and desire to secure by Letters Patent of the United States is:

1. A stabilized surface acoustic wave comb spectrum generator comprising:
   an oscillatory loop having variable delay means including a surface acoustic wave delay line, said variable delay means having a control signal input thereto to adjust the phase of signals circulating in the oscillatory loop as a function of control signal applied thereto, amplification means to provide loop gain, a nonlinear means for permitting only pulsed RF signals in excess of a threshold magnitude to circulate through said loop, and means for coupling out of said loop a fraction of the energy of signals circulating in the loop;
   an output circuit connected to said means for coupling for providing output signals at the frequencies of oscillations within said loop;
   feedback means connected to said output circuit for providing a signal indication of the actual pulse repetition frequency of signals circulating in said oscillatory loop;
   reference means for providing reference signals at a frequency related to a desired pulse repetition frequency of signals circulating in said oscillatory loop;
   a phase comparator responsive to said feedback means and to said reference means for providing an error signal representative of the deviation of said actual pulse repetition frequency from said desired pulse repetition frequency, said error signal being connected to said control signal input of said variable delay means, thereby to stabilize the pulse repetition frequency of signals circulating in said oscillatory loop.

2. A comb spectrum generator according to claim 1 wherein said variable delay means includes a surface acoustic wave delay line coupled to a variable delay device, said variable delay device being responsive to said error signal to adjust the phase of signals circulating in said oscillatory loop.

3. A comb spectrum generator according to claim 1 wherein said variable delay means comprises a voltage controlled, variable surface acoustic wave delay line, the delay time of which is responsive to said error signal applied thereto.

* * * * *